(12) United States Patent
Puligadda et al.

(10) Patent No.: US 9,224,631 B2
(45) Date of Patent: Dec. 29, 2015

(54) MULTIPLE BONDING LAYERS FOR THIN-WAFER HANDLING

(71) Applicant: Brewer Science Inc., Rolla, MO (US)

(72) Inventors: Rama Puligadda, Rolla, MO (US); Xing-Fu Zhong, Rolla, MO (US); Tony D. Flaim, St. James, MO (US); Jeremy McCutcheon, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 14/191,544

(22) Filed: Feb. 27, 2014

(65) Prior Publication Data

US 2014/0174627 A1    Jun. 26, 2014

Related U.S. Application Data

(62) Division of application No. 13/198,294, filed on Aug. 4, 2011.

(60) Provisional application No. 61/371,517, filed on Aug. 6, 2010.

(51) Int. Cl.
*H01L 21/00* (2006.01)
*H01L 21/683* (2006.01)
(Continued)

(52) U.S. Cl.
CPC ........ *H01L 21/6835* (2013.01); *B32B 38/0008* (2013.01); *B32B 38/10* (2013.01);
(Continued)

(58) Field of Classification Search
CPC . H01L 21/6835; H01L 21/6836; H01L 24/83; H01L 21/2007; B32B 38/10; B32B 43/006; B32B 38/0008; Y10T 428/31935; Y10T 428/31551; Y10T 428/31725

USPC ............................................ 428/212; 438/455
See application file for complete search history.

(56) References Cited

U.S. PATENT DOCUMENTS

| | | | | |
|---|---|---|---|---|
| 4,692,205 A | * | 9/1987 | Sachdev et al. | 174/256 |
| 7,482,249 B2 | * | 1/2009 | Jakob et al. | 438/460 |

(Continued)

FOREIGN PATENT DOCUMENTS

| | | | | |
|---|---|---|---|---|
| CN | 1698077 A | 11/2005 | | G09F 9/33 |
| CN | 1868040 A | 11/2006 | | H01L 21/304 |

(Continued)

OTHER PUBLICATIONS

Extended European Search Report issued in connection with corresponding European Patent Application No. 11836791.1, dated Jul. 7, 2014.

(Continued)

*Primary Examiner* — Laura Menz
(74) *Attorney, Agent, or Firm* — Kusner & Jaffe

(57) ABSTRACT

Multiple bonding layer schemes that temporarily join semiconductor substrates are provided. In the inventive bonding scheme, at least one of the layers is directly in contact with the semiconductor substrate and at least two layers within the scheme are in direct contact with one another. The present invention provides several processing options as the different layers within the multilayer structure perform specific functions. More importantly, it will improve performance of the thin-wafer handling solution by providing higher thermal stability, greater compatibility with harsh backside processing steps, protection of bumps on the front side of the wafer by encapsulation, lower stress in the debonding step, and fewer defects on the front side.

12 Claims, 9 Drawing Sheets

(51) Int. Cl.
*H01L 21/20* (2006.01)
*H01L 23/00* (2006.01)
*B32B 38/00* (2006.01)
*B32B 38/10* (2006.01)
*B32B 43/00* (2006.01)

(52) U.S. Cl.
CPC ......... *B32B 43/006* (2013.01); *H01L 21/2007* (2013.01); *H01L 21/6836* (2013.01); *H01L 24/83* (2013.01); *H01L 2221/6834* (2013.01); *H01L 2221/68318* (2013.01); *H01L 2221/68327* (2013.01); *H01L 2221/68381* (2013.01); *H01L 2924/12041* (2013.01); *H01L 2924/1461* (2013.01); *H01L 2924/351* (2013.01); *Y10T 156/10* (2015.01); *Y10T 428/24942* (2015.01); *Y10T 428/26* (2015.01); *Y10T 428/31511* (2015.04); *Y10T 428/31551* (2015.04); *Y10T 428/31663* (2015.04); *Y10T 428/31721* (2015.04); *Y10T 428/31725* (2015.04); *Y10T 428/31935* (2015.04); *Y10T 428/31938* (2015.04)

(56) References Cited

U.S. PATENT DOCUMENTS

| | | | |
|---|---|---|---|
| 7,727,808 B2 | 6/2010 | Kapusta et al. | 438/109 |
| 8,232,117 B2 | 7/2012 | Basin et al. | 438/21 |
| 2005/0000636 A1 | 1/2005 | Geiger et al. | 156/247 |
| 2005/0233504 A1 | 10/2005 | Doi et al. | 438/127 |
| 2007/0066184 A1 | 3/2007 | Nagamoto et al. | 451/41 |
| 2007/0185310 A1 | 8/2007 | Moore et al. | 530/210 |
| 2007/0218649 A1 | 9/2007 | Hernandez | 438/458 |
| 2008/0166525 A1 | 7/2008 | Swinnen et al. | 428/174 |
| 2008/0173970 A1 | 7/2008 | Pillalamarri | 257/499 |
| 2008/0200011 A1 | 8/2008 | Pillalamarri et al. | 438/458 |
| 2009/0035590 A1 | 2/2009 | Sullivan et al. | 428/457 |
| 2009/0038750 A1 | 2/2009 | Hong et al. | 156/247 |
| 2009/0181331 A1 | 7/2009 | Mori et al. | 430/324 |
| 2009/0211791 A1 | 8/2009 | Tredwell et al. | 174/254 |
| 2009/0218560 A1 | 9/2009 | Flaim et al. | 257/9 |
| 2010/0112305 A1 | 5/2010 | Hong et al. | 428/195.1 |
| 2010/0155936 A1 | 6/2010 | Codding et al. | 257/734 |
| 2010/0175914 A1 | 7/2010 | Pramanik et al. | 174/256 |
| 2010/0206479 A1 | 8/2010 | Pillalamarri et al. | 156/344 |

FOREIGN PATENT DOCUMENTS

| | | | | |
|---|---|---|---|---|
| CN | 101764047 A | 6/2010 | | H01L 21/00 |
| CN | 101925996 A | 12/2010 | | H01L 23/12 |
| JP | 2006201332 A | 8/2006 | | G03F 7/42 |
| JP | 2007281446 A | 10/2007 | | H01L 21/304 |
| JP | 2008-60361 | 3/2008 | | H01L 21/304 |
| JP | 2008521214 A | 6/2008 | | H01L 21/6835 |
| JP | 2009168913 A | 7/2009 | | G03F 7/32 |

OTHER PUBLICATIONS

English-language translation of Office Action (dated Jan. 29, 2015) issued in connection with corresponding Chinese Patent Application 201180047933.0.

* cited by examiner

MULTIPLE BONDING LAYERS FOR THIN-WAFER HANDLING

RELATED APPLICATIONS

The present application is a divisional of U.S. application Ser. No. 13/198,294, filed Aug. 4, 2011, which claims the benefit of U.S. Provisional Application No. 61/371,517, filed Aug. 6, 2010, said patent applications fully incorporated herein by reference.

FEDERALLY SPONSORED RESEARCH/DEVELOPMENT PROGRAM

This invention was made with government support under contract number FA8650-05-D-5806 awarded to General Dynamics Information Technology by the Air Force Research Laboratory. The United States government has certain rights in the invention.

FIELD OF THE INVENTION

The present invention is broadly concerned with novel temporary wafer bonding methods utilizing multiple layer bonding systems. The inventive methods can support a device wafer on a carrier substrate during wafer thinning and other backside processing.

BACKGROUND OF THE INVENTION

Integrated circuits, power semiconductors, light-emitting diodes, photonic circuits, microelectromechanical systems (MEMS), embedded passive arrays, packaging interposers, and a host of other silicon- and compound semiconductor-based microdevices are produced collectively in arrays on wafer substrates ranging from 1-12 inches in diameter. The devices are then separated into individual devices or dies that are packaged to allow practical interfacing with the macroscopic environment, for example, by interconnection with a printed wiring board. It has become increasingly popular to construct the device package on or around the die while it is still part of the wafer array. This practice, which is referred to as wafer-level packaging, reduces overall packaging costs and allows a higher interconnection density to be achieved between the device and its microelectronic environment than with more traditional packages that usually have outside dimensions several times larger than the actual device.

Until recently, interconnection schemes have generally been confined to two dimensions, meaning the electrical connections between the device and the corresponding board or packaging surface to which it is mounted have all been placed in a horizontal, or x-y, plane. The microelectronics industry has now recognized that significant increases in device interconnection density and corresponding reductions in signal delay (as a result of shortening the distance between electrical connection points) can be achieved by stacking and interconnecting devices vertically, that is, in the z-direction. Two common requirements for device stacking are: (1) thinning of the device in the through-wafer direction from the backside; and (2) subsequently forming through-wafer electrical connections, commonly referred to as through-silicon-vias or "TSVs," that terminate on the backside of the device. For that matter, semiconductor device thinning has now become a standard practice even when devices are not packaged in a stacked configuration because it facilitates heat dissipation and allows a much smaller form factor to be achieved with compact electronic products such as cellular telephones.

There is growing interest in thinning semiconductor devices to less than 100 microns to reduce their profiles, especially when they or the corresponding packages in which they reside are stacked, and to simplify the formation of backside electrical connections on the devices. Silicon wafers used in high-volume integrated circuit production are typically 200 or 300 mm in diameter and have a through-wafer thickness of about 750 microns. Without thinning, it would be nearly impossible to form backside electrical contacts that connect with front-side circuitry by passing the connections through the wafer. Highly efficient thinning processes for semiconductor-grade silicon and compound semiconductors based on mechanical grinding (back-grinding) and polishing as well as chemical etching are now in commercial use. These processes allow device wafer thickness to be reduced to less than 100 microns in a few minutes while maintaining precise control over cross-wafer thickness uniformity.

Device wafers that have been thinned to less than 100 microns, and especially those thinned to less than 60 microns, are extremely fragile and must be supported over their full dimensions to prevent cracking and breakage. Various wafer wands and chucks have been developed for transferring ultra-thin device wafers, but the problem still exists of how to support the wafers during back-grinding and TSV-formation processes that include steps such as chemical-mechanical polishing (CMP), lithography, etching, deposition, annealing, and cleaning, because these steps impose high thermal and mechanical stresses on the device wafer as it is being thinned or after thinning. An increasingly popular approach to ultra-thin wafer handling involves mounting the full-thickness device wafer face down to a rigid carrier with a polymeric adhesive. It is then thinned and processed from the backside. The fully processed, ultra-thin wafer is then removed, or debonded, from the carrier by thermal, thermo-mechanical, or chemical processes after the backside processing has been completed.

Common carrier materials include silicon (e.g., a blank device wafer), soda lime glass, borosilicate glass, sapphire, and various metals and ceramics. The carriers may be square or rectangular but are more commonly round and are sized to match the device wafer so that the bonded assembly can be handled in conventional processing tools and cassettes. Sometimes the carriers are perforated to speed the debonding process when a liquid chemical agent is used to dissolve or decompose the polymeric adhesive as the means for release.

The polymeric adhesives used for temporary wafer bonding are typically applied by spin coating or spray coating from solution or laminating as dry-film tapes. Spin- and spray-applied adhesives are increasingly preferred because they form coatings with higher thickness uniformity than tapes can provide. Higher thickness uniformity translates into greater control over cross-wafer thickness uniformity after thinning. The polymeric adhesives exhibit high bonding strength to the device wafer and the carrier.

The polymeric adhesive may be spin-applied onto the device wafer, the carrier, or both, depending on the thickness and coating planarity (flatness) that is required. The coated wafer is baked to remove all of the coating solvent from the polymeric adhesive layer. The coated wafer and carrier are then placed in contact in a heated mechanical press for bonding. Sufficient temperature and pressure are applied to cause the adhesive to flow and fill into the device wafer structural features and achieve intimate contact with all areas of the device wafer and carrier surfaces.

Debonding of a device wafer from the carrier following backside processing is typically performed in one of four ways:

(1) Chemical—The bonded wafer stack is immersed in, or sprayed with, a solvent or chemical agent to dissolve or decompose the polymeric adhesive.

(2) Photo-Decomposition—The bonded wafer stack is irradiated with a light source through a transparent carrier to photo-decompose the adhesive boundary layer that is adjacent to the carrier. The carrier can then be separated from the stack, and the balance of the polymeric adhesive is peeled from the device wafer while it is held on a chuck.

(3) Thermo-Mechanical—The bonded wafer stack is heated above the softening temperature of the polymeric adhesive, and the device wafer is then slid or pulled away from the carrier while being supported with a full-wafer holding chuck.

(4) Thermal Decomposition—The bonded wafer stack is heated above the decomposition temperature of the polymeric adhesive, causing it to volatilize and lose adhesion to the device wafer and carrier.

Each of these debonding methods has drawbacks that seriously limit its use in a production environment. For example, chemical debonding by dissolving the polymeric adhesive is a slow process because the solvent must diffuse over large distances through the viscous polymer medium to effect release. That is, the solvent must diffuse from the edge of the bonded substrates, or from a perforation in the carrier, into the local region of the adhesive. In either case, the minimum distance required for solvent diffusion and penetration is at least 3-5 mm and can be much more, even with perforations to increase solvent contact with the adhesive layer. Treatment times of several hours, even at elevated temperatures (>60° C.), are usually required for debonding to occur, meaning wafer throughput will be low.

Photo-decomposition is likewise a slow process because the entire bonded substrate cannot be exposed at one time. Instead, the exposing light source, which is usually a laser having beam cross-section of only a few millimeters, must be focused on a small area at a time to deliver sufficient energy for decomposition of the adhesive bond line to occur. The beam is then scanned (or rastered) across the substrate in a serial fashion to debond the entire surface, which leads to long debonding times.

While thermo-mechanical (TM) debonding can be performed typically in a few minutes, it has other limitations that can reduce device yield. Backside processes for temporarily bonded device wafers often involve working temperatures higher than 200° C. or even 300° C. The polymeric adhesives used for TM debonding must neither decompose nor soften excessively at or near the working temperature, otherwise, debonding would occur prematurely. As a result, the adhesives are normally designed to soften sufficiently at 20-50° C. above the working temperature for debonding to occur. The high temperature required for debonding imposes significant stresses on the bonded pair as a result of thermal expansion. At the same time, the high mechanical force required to move the device wafer away from the carrier by a sliding, lifting, or twisting motion creates additional stress that can cause the device wafer to break or produces damage within the microscopic circuitry of individual devices, which leads to device failure and yield loss.

Thermal decomposition (TD) debonding is also prone to wafer breakage. Gases are produced when the polymeric adhesive is decomposed, and these gases can become trapped between the device wafer and the carrier before the bulk of the adhesive has been removed. The accumulation of trapped gases can cause the thin device wafer to blister and crack or even rupture. Another problem with TD debonding is that polymer decomposition is often accompanied by the formation of intractable, carbonized residues that cannot be removed from the device wafer by common cleaning procedures.

The limitations of these prior art methods have created the need for new modes of carrier-assisted thin wafer handling that provide high wafer throughput and reduce or eliminate the chances for device wafer breakage and internal device damage.

SUMMARY OF THE INVENTION

The present invention overcomes the prior art problems by providing a temporary bonding method comprising providing a stack comprising:
 a first substrate having a back surface and a device surface;
 a first bonding layer adjacent the device surface and having a softening temperature;
 a second bonding layer adjacent the first bonding layer and having a softening temperature, wherein the softening temperature of the first bonding layer is at least about 20° C. greater than the softening temperature of the second bonding layer; and
 a second substrate having a carrier surface, the second bonding layer being adjacent the carrier surface.

The first and second substrates are then separated.

The invention also provides an article comprising a first substrate having a back surface and a device surface. The article further comprises a first bonding layer adjacent the device surface and having a softening temperature. There is a second bonding layer adjacent the first bonding layer and having a softening temperature, with the softening temperature of the first bonding layer being at least about 20° C. greater than the softening temperature of the second bonding layer. The article also includes a second substrate having a carrier surface, with the second bonding layer being adjacent the carrier surface.

In a further embodiment of the invention, a temporary bonding method is provided. In the method, a stack is provided, and the stack comprises:
 a first substrate having a back surface and a device surface;
 a first rigid layer adjacent the device surface;
 a bonding layer adjacent the first rigid layer; and
 a second substrate having a carrier surface, the bonding layer being adjacent the carrier surface. The stack further comprises one or both of the following:
 a lift-off layer between the device surface and the first rigid layer; or
 a second rigid layer between the bonding layer and the carrier surface.

The first and second substrates are then separated.

The invention also provides an article comprising a first substrate having a back surface and a device surface. The article further comprises a first rigid layer adjacent the device surface, a bonding layer adjacent the first rigid layer, and a second substrate having a carrier surface. The bonding layer is adjacent the carrier surface, and the article further comprises one or both of the following:
 a lift-off layer between the device surface and the first rigid layer; or
 a second rigid layer between the bonding layer and the carrier surface.

In yet another embodiment of the invention, a temporary bonding method is provided where the method comprises providing a stack comprising:
 a first substrate having a back surface and a device surface, the device surface having a peripheral region and a central region;

a second substrate having a carrier surface;
an edge bond adjacent the peripheral region and the carrier surface; and
at least one layer selected from the group consisting of:
a lift-off layer between the edge bond and the device surface;
a lift-off layer between the edge bond and the carrier surface;
an adhesion promoter layer between the edge bond and the device surface;
an adhesion promoter layer between the edge bond and the carrier surface;
a bonding layer between said edge bond and said device surface; and
a bonding layer between said edge bond and said carrier surface.

The first and second substrates are then separated.

In a final embodiment of the invention, an article is provided. The article comprises a first substrate having a back surface and a device surface, and the device surface has a peripheral region and a central region. The article further comprises a second substrate having a carrier surface, an edge bond adjacent the peripheral region and the carrier surface, and at least one layer selected from the group consisting of:
a lift-off layer between the edge bond and the device surface;
a lift-off layer between the edge bond and the carrier surface;
an adhesion promoter layer between the edge bond and the device surface;
an adhesion promoter layer between the edge bond and the carrier surface;
a bonding layer between said edge bond and said device surface; and
a bonding layer between said edge bond and said carrier surface.

DETAILED DESCRIPTION OF THE INVENTION

Figure 1:
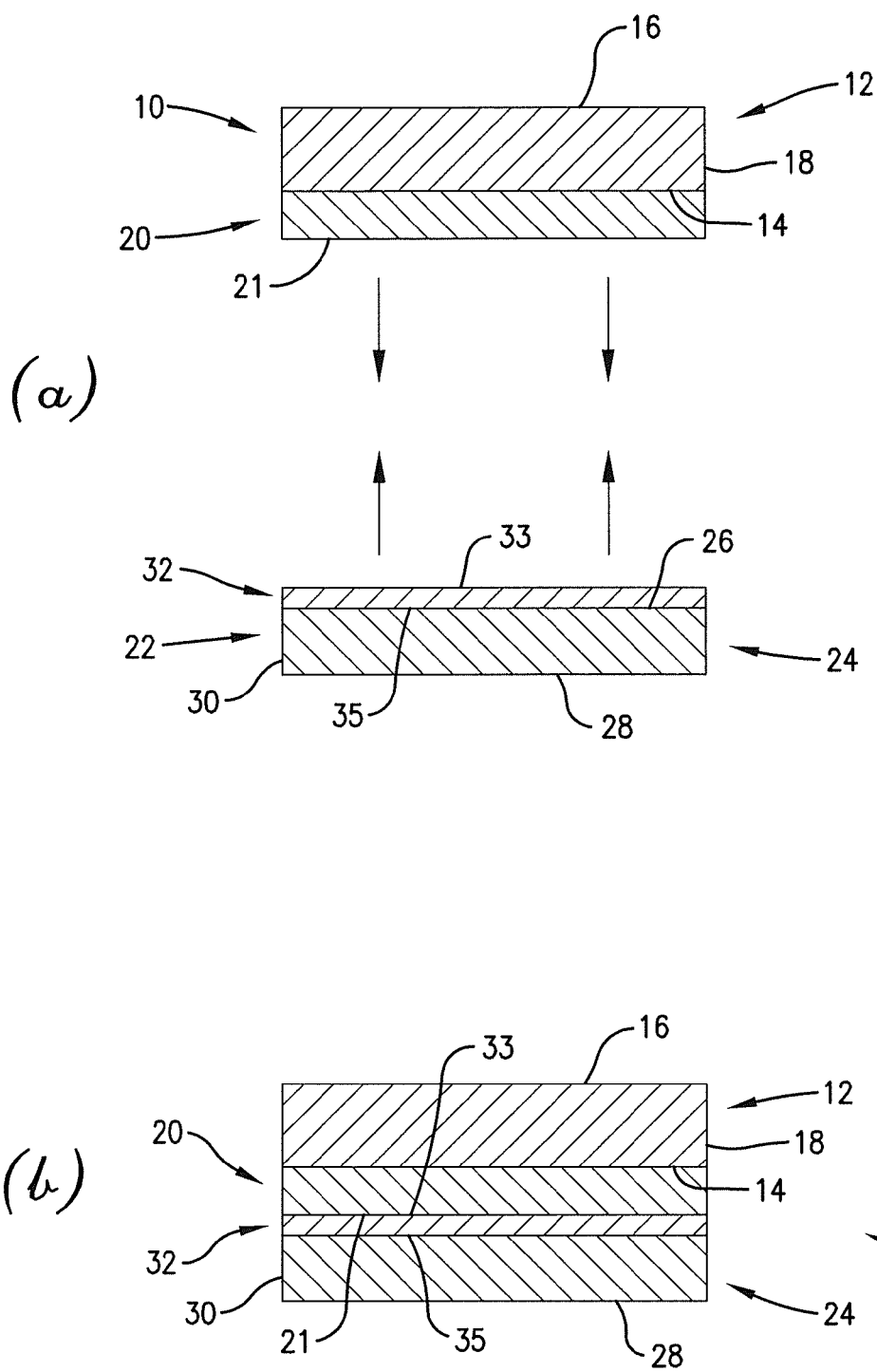
FIGS. 1a-1b are cross-sectional views of schematic drawings showing a preferred embodiment of the invention, as further exemplified in Examples 5-9.

In more detail, the present invention provides methods of forming microelectronic structures using multilayer bonding schemes. While the drawings illustrate, and the specification describes, certain preferred embodiments of the invention, it is to be understood that such disclosure is by way of example only. Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. There is no intent to limit the principles of the present invention to the particular disclosed embodiments. For example, in the drawings, the size and relative sizes of layers and regions may be exaggerated for clarity. In addition, embodiments of the present invention should not be construed as limited to the particular shapes of regions illustrated herein but are to include deviations in shapes that result, for example, from manufacturing. For example, a region illustrated as a rectangle may have rounded or curved features. Thus, the regions illustrated in the figures are schematic in nature and their shapes are not intended to illustrate the precise shape of a region of a device or of topography and are not intended to limit the scope of the present invention.

1. Bilayer Bonding Scheme I

Referring to FIG. 1(a), a precursor structure 10 is depicted in a schematic and cross-sectional view. Structure 10 includes a first substrate 12. Substrate 12 has a front or device surface 14, a back surface 16, and an outermost edge 18. Although substrate 12 can be of any shape, it would typically be circular in shape. Preferred first substrates 12 include device wafers such as those whose device surfaces comprise arrays of devices (not shown) selected from the group consisting of integrated circuits, MEMS, microsensors, power semiconductors, light-emitting diodes, photonic circuits, interposers, embedded passive devices, and other microdevices fabricated on or from silicon and other semiconducting materials such as silicon-germanium, gallium arsenide, and gallium nitride. The surfaces of these devices commonly comprise structures (again, not shown) formed from one or more of the following materials: silicon, polysilicon, silicon dioxide, silicon (oxy) nitride, metals (e.g., copper, aluminum, gold, tungsten, tantalum), low k dielectrics, polymer dielectrics, and various metal nitrides and silicides. The device surface 14 can also include at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

A composition is applied to the first substrate 12 to form a first bonding layer 20 on the device surface 14, as shown in FIG. 1(a). Bonding layer 20 has an upper surface 21 remote from first substrate 12, and preferably, the first bonding layer 20 is formed directly adjacent the device surface 14 (i.e., without any intermediate layers between the first bonding layer 20 and substrate 12). The composition can be applied by any known application method, with one preferred method being spin-coating the composition at speeds of from about 500 rpm to about 5,000 rpm (preferably from about 500 rpm to about 2,000 rpm) for a time period of from about 5 seconds to about 120 seconds (preferably from about 30 seconds to about 90 seconds). After the composition is applied, it is preferably heated to a temperature of from about 80° C. to about 250° C., and more preferably from about 170° C. to about 220° C. and for time periods of from about 60 seconds to about 8 minutes (preferably from about 90 seconds to about 6 minutes). Depending upon the composition used to form the first bonding layer 20, baking can also initiate a crosslinking reaction to cure the layer 20. In some embodiments, it is preferable to subject the layer to a multi-stage bake process, depending upon the composition utilized. Also, in some instances, the above application and bake process can be repeated on a further aliquot of the composition, so that the first bonding layer 20 is "built" on the first substrate 12 in multiple steps.

A second precursor structure 22 is also depicted in a schematic and cross-sectional view in FIG. 1(*a*). Second precursor structure 22 includes a second substrate 24. In this embodiment, second substrate 24 is a carrier wafer. That is, second substrate 24 has a front or carrier surface 26, a back surface 28, and an outermost edge 30. Although second substrate 24 can be of any shape, it would typically be circular in shape and sized similarly to first substrate 12. Preferred second substrates 24 include silicon, sapphire, quartz, metals (e.g., aluminum, copper, steel), and various glasses and ceramics.

A second composition is applied to the second substrate 24 to form a second bonding layer 32 on the carrier surface 26, as shown in FIG. 1(*a*). Second bonding layer 32 has an upper surface 33 remote from second substrate 24, and a lower surface 35 adjacent second substrate 24. Preferably, the second bonding layer 32 is formed directly adjacent the carrier surface 26 (i.e., without any intermediate layers between the second bonding layer 32 and second substrate 24). The composition can be applied by any known application method, with one preferred method being spin-coating the composition at speeds of from about 500 rpm to about 5,000 rpm (preferably from about 500 rpm to about 2,000 rpm) for a time period of from about 5 seconds to about 120 seconds (preferably from about 30 seconds to about 90 seconds). After the composition is applied, it is preferably heated to a temperature of from about 80° C. to about 250° C., and more preferably from about 170° C. to about 220° C. and for time periods of from about 60 seconds to about 8 minutes (preferably from about 90 seconds to about 6 minutes). Depending upon the composition used to form the second bonding layer 32, baking can also initiate a crosslinking reaction to cure the layer 32. In some embodiments, it is preferable to subject the layer to a multi-stage bake process, depending upon the composition utilized.

Figure 2:
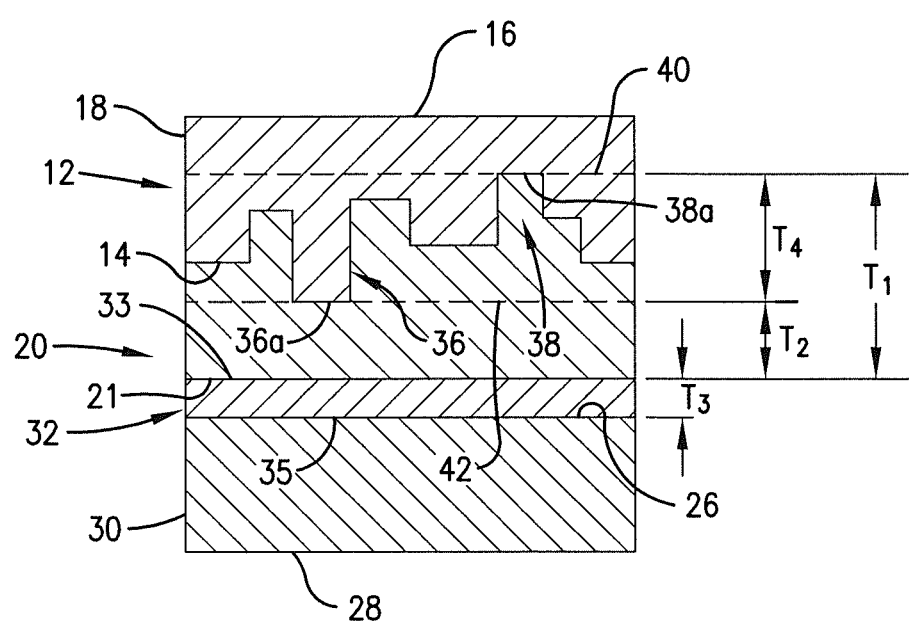
FIG. 2 is a cross-sectional view of a schematic drawing illustrating how thicknesses are determined.

The thickness of first and second bonding layers 20 and 32 (as well as other layers as described herein) can best be illustrated by reference to FIG. 2, where like numbering has been used to represent like parts. Device surface 14 has been drawn in FIG. 2 to schematically depict the variation in topography on device surface 14 due to the presence of the above-described devices as well as of raised features, contact holes, via holes, lines, trenches, etc., that are present on or in device surface 14. Among the various features found on device surface 14 are highest feature 36 and lowest feature 38. (As used herein, "highest" refers to the feature extending the farthest from back surface 16 of first substrate 12, while "lowest" refers to the feature whose lowest point is closest to back surface 16 of first substrate 12.) Highest feature 36 has an uppermost surface 36*a*, while lowest feature 38 has a lowermost surface or point 38*a*. When referring to the thickness of a layer that has been applied to a topographical (i.e., non-planar) surface, two thicknesses may be references. $T_1$ refers to the distance from a lower plane 40 defined by lowermost surface or point 38*a* and extending to upper surface 21, as exemplified in FIG. 2. $T_2$ refers to the layer's thickness as measured above the uppermost surface 36*a*. Specifically, and as shown in FIG. 2, this thickness $T_2$ begins at upper plane 42 and extends to the upper surface 21. When referring to the thickness of a layer that has been applied to a planar (or substantially planar) surface, that thickness is represented by $T_3$ in FIG. 2, and is the distance between lower surface 35 and upper surface 33 of layer 32. Finally, in some instances, thickness $T_4$ is used, and it refers to the distance from lower plane 40 to upper plane 42. All thicknesses refer to average thicknesses taken over five measurements.

In the embodiment of this invention, first bonding layer 20 preferably has a thickness $T_1$ that is at least equal to $T_4$, preferably from about $1.1T_4$ to about $1.5T_4$, and more preferably from about $1.2T_4$ to about $1.3T_4$. This will typically result in a thickness $T_1$ of at least about 24 µm, more preferably from about 45 µm to about 200 µm, and even more preferably from about 50 µm to about 150 µm. Furthermore, first bonding layer 20 preferably has a thickness $T_2$ of at least about 5 µm, more preferably from about 5 µm to about 50 µm, and even more preferably from about 10 µm to about 30 µm. Second bonding layer 32 has a thickness $T_3$ of less than about 35 µm, preferably from about 1 µm to about 35 µm, more preferably from about 1 µm to about 25 µm, and even more preferably from about 1 µm to about 15 µm.

First bonding layer 20 preferably has a softening point (ring and ball) that is at least about 20° C. higher than the softening point of second bonding layer 32, more preferably from about 20° C. to about 200° C. higher, and even more preferably from about 20° C. to about 100° C. higher. This will typically result in first bonding layer 20 having a softening point that is at least about 100° C., preferably from about 150° C. to about 400° C., and more preferably from about 200° C. to about 300° C. Furthermore, typical softening points of second bonding layer 32 will be less than about 220° C., preferably from about 50° C. to about 220° C., and more preferably from about 100° C. to about 150° C.

The materials from which first and second bonding layers 20 and 32 are formed should be capable of forming a strong adhesive bond with the first and second substrates 12 and 24, respectively, as well as with one another. Anything with an adhesion strength of greater than about 50 psig, preferably from about 80 psig to about 250 psig, and more preferably from about 100 psig to about 150 psig as determined by ASTM D4541/D7234, would be desirable for use as first and second bonding layers 20 and 32.

Advantageously, the compositions for use in forming first and second bonding layers 20 and 32 can be selected from commercially available bonding compositions that would be capable of being formed into layers possessing the above properties. Typical such compositions are organic and will comprise a polymer or oligomer dissolved or dispersed in a solvent system. The polymer or oligomer is typically selected from the group consisting of polymers and oligomers of cyclic olefins, epoxies, acrylics, silicones, styrenics, vinyl halides, vinyl esters, polyamides, polyimides, polysulfones, polyethersulfones, cyclic olefins, polyolefin rubbers, and polyurethanes, ethylene-propylene rubbers, polyamide esters, polyimide esters, polyacetals, and polyvinyl butyral. Typical solvent systems will depend upon the polymer or oligomer selection. Typical solids contents of the compositions will range from about 1% to about 60% by weight, and preferably from about 3% to about 40% by weight, based upon the total weight of the composition taken as 100% by weight. Some suitable compositions are described in U.S. Patent Publication Nos. 2007/0185310, 2008/0173970, 2009/0038750, and 2010/0112305, each incorporated by reference herein.

Structures 10 and 22 are then pressed together in a face-to-face relationship, so that upper surface 21 of first bonding layer 20 is in contact with upper surface 33 of second bonding layer 32 (FIG. 1(*b*)). While pressing, sufficient pressure and heat are applied for a sufficient amount of time so as to effect bonding of the two structures 10 and 22 together to form bonded stack 34. The bonding parameters will vary depending upon the compositions from which bonding layers 20 and 32 are formed, but typical temperatures during this step will range from about 150° C. to about 375° C., and preferably from about 160° C. to about 350° C., with typical pressures ranging from about 1,000 N to about 5,000 N, and preferably from about 2,000 N to about 4,000 N, for a time period of from about 30 seconds to about 5 minutes, and more preferably from about 2 minutes to about 4 minutes.

At this stage, the first substrate 12 can be safely handled and subjected to further processes that might otherwise have damaged first substrate 12 without being bonded to second substrate 24. Thus, the structure can safely be subjected to backside processing such as back-grinding, CMP, etching, metal and dielectric deposition, patterning (e.g., photolithography, via etching), passivation, annealing, and combinations thereof, without separation of substrates 12 and 24 occurring, and without infiltration of any chemistries encountered during these subsequent processing steps. Not only can first bonding layer 20 and second bonding layer 32 survive these processes, they can also survive processing temperatures up to about 450° C., preferably from about 200° C. to about 400° C., and more preferably from about 200° C. to about 350° C.

Once processing is complete, the substrates 12 and 24 can be separated by any number of separation methods (not shown). One method involves dissolving one or both of the first and second bonding layers 20, 32 in a solvent (e.g., limonene, dodecene, propylene glycol monomethyl ether (PGME)). Alternatively, substrates 12 and 24 can also be separated by first mechanically disrupting or destroying the periphery of one or both of first and second bonding layers 20, 32 using laser ablation, plasma etching, water jetting, or other high energy techniques that effectively etch or decompose first and second bonding layers 20, 32. It is also suitable to first saw or cut through the first and second bonding layers 20, 32 or cleave the layers 20, 32 by some equivalent means. Regardless of which of the above means is utilized, a low mechanical force (e.g., finger pressure, gentle wedging) can then be applied to completely separate the substrates 12 and 24.

The most preferred separation method involves heating the bonded stack 34 to temperatures of at least about 100° C., preferably from about 150° C. to about 220° C., and more preferably from about 180° C. to about 200° C. It will be appreciated that at these temperatures, second bonding layer 32 will soften, allowing the substrates 12 and 24 to be separated (e.g., by a slide debonding method, such as that described in U.S. Patent Publication No. 2008/0200011, incorporated by reference herein). After separation, any remaining first or second bonding layer 20 and 32 can be removed with a solvent capable of dissolving the particular layer 20 or 32. In some embodiments, the composition for forming first bonding layer 20 will be selected so that it is suitable leave some or all of it on the first substrate 12 permanently. In these instances, first bonding layer 20 will serve some function (e.g., gap fill) in subsequent wafer processing steps, an advantage missing from prior art processes.

It will be appreciated that this bilayer embodiment provides a number of advantages. The bonding temperatures and overall thermal stability of the structure can be controlled due to the inventive methods. That is, the inventive method allows the use of higher processing temperatures while simultaneously making bonding and debonding possible at lower temperatures.

2. Bilayer Bonding Scheme II

Figure 3:
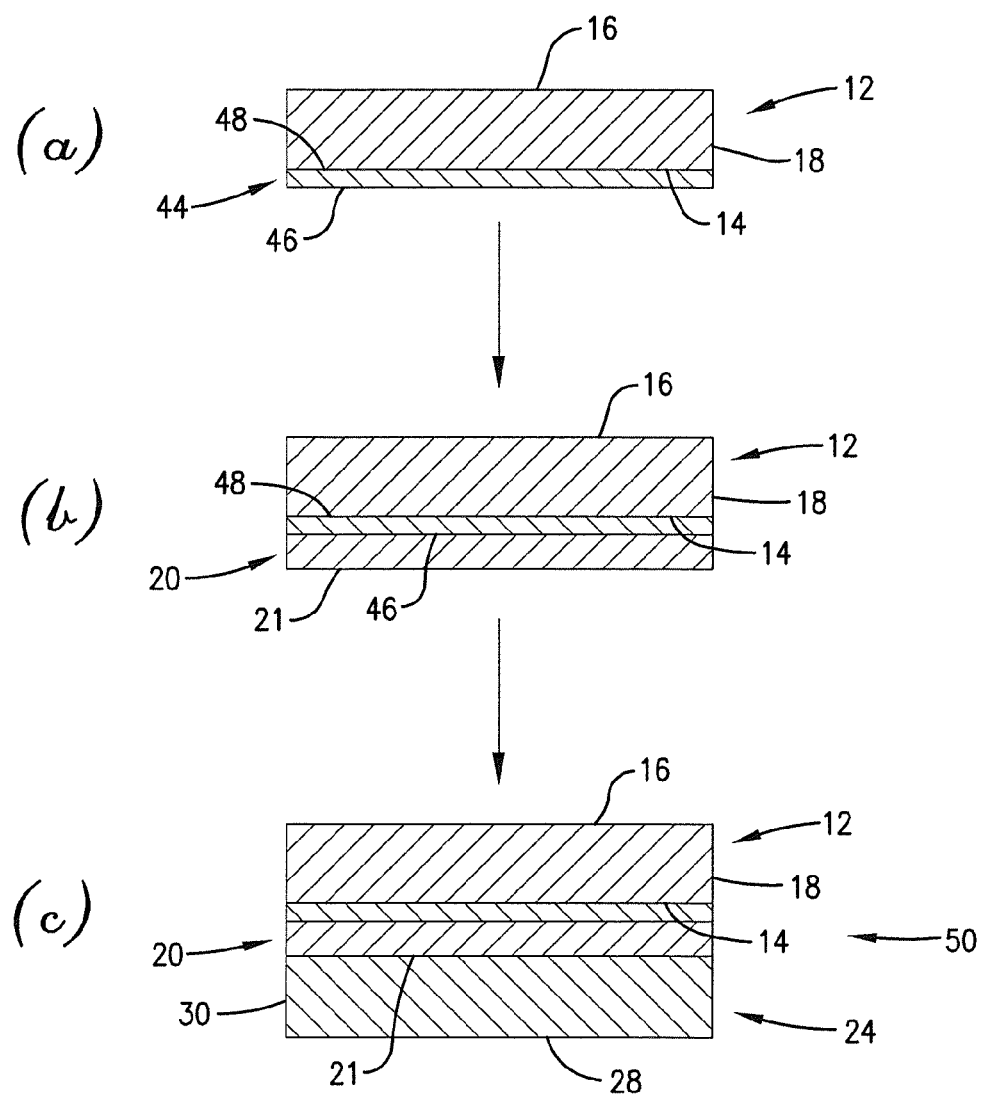
FIGS. 3a-3c are cross-sectional views of schematic drawings depicting another embodiment of the invention, as further exemplified in Examples 10-16.

The second bilayer bonding scheme is shown in FIG. 3, with like numbers representing like parts. In this embodiment, a "cleaning" or lift-off layer 44 having an upper surface 46 and lower surface 48 is formed on device surface 14. Lift-off layer 44 can be formed by any known application method, with one preferred method being spin-coating the composition used to form layer 44 at speeds of from about 500 rpm to about 5,000 rpm (preferably from about 500 rpm to about 2,000 rpm) for a time period of from about 5 seconds to about 120 seconds (preferably from about 30 seconds to about 90 seconds). After the composition is applied, it is preferably heated to a temperature of from about 60° C. to about 250° C., and more preferably from about 80° C. to about 220° C. and for time periods of from about 60 seconds to about 4 minutes (preferably from about 90 seconds to about 2 minutes). In some embodiments, it is preferable to subject the layer to a multi-stage bake process, depending upon the composition utilized. Depending upon the composition used to form the lift-off layer 44, baking can also initiate a crosslinking reaction to cure the layer 44.

Lift-off layer 44 preferably has a thickness $T_1$ of less than about 3 μm, more preferably from about 0.5 μm to about 3 μm, and even more preferably from about 1 μm to about 1.5 μm. In other embodiments, lift-off layer 44 is a conformal layer, so it would not have the above thickness.

The compositions used to form lift-off layer 44 should be selected so that layer 44 is soluble in solutions selected from the group consisting of 1% hydrochloric acid aqueous solution, 50% acetic acid aqueous solution, isopropanol, 1-dodecene, R-limonene, cyclopentanone, PGME, and tetramethylammonium hydroxide (TMAH). More specifically, lift-off layer 44 will be at least about 95%, preferably at least about 99%, and preferably 100% dissolved/removed after about 4-5 hours of contact with the particular remover solution.

Preferred compositions for forming lift-off layer 44 can be selected from commercially available compositions possessing the above properties. Examples of such compositions include those selected from the group consisting of poly (vinyl pyridine) and polyamic acids. Two preferred such compositions are ProLIFT® and the WGF series of wet-developable materials (available from Brewer Science, Inc.). A particularly preferred composition for use is described in U.S. Patent Publication No. 2009/0035590, incorporated by reference herein.

Next, a bonding layer 20 is formed on lift-off layer 44 (FIG. 3(b)). Bonding layer 20 preferably has a thickness $T_1$ as described with respect to FIG. 1, and a thickness $T_2$ of at least about 5 μm, more preferably from about 5 μm to about 50 μm, and even more preferably from about 10 μm to about 30 μm. A second substrate 24 is then bonded to bonding layer 20 (FIG. 3(c)), as described previously, to form a bonded stack 50. The bonded stack 50 can then be subjected to further processing as described above.

Once the first and second substrates 12 and 24 are ready to be separated, the bonded stack 50 is exposed to one of the above remover solutions (preferably for time periods of from about 1 minute to about 5 hours, and more preferably from about 2 minutes to about 60 minutes), so that the solution will dissolve lift-off layer 44, thus allowing the substrates 12 and 24 to be separated. Advantageously, in embodiments where lift-off layer 44 is functioning as a "cleaning" layer, the substrates 12 and 24 can be separated by heating to soften bonding layer 20 sufficiently to allow substrates 12 and 24 to be separated. Once the substrates 12 and 24 have been separated, lift-off/cleaning layer 44 can be removed with a remover solution, and this will simultaneously cause any remaining residue of bonding layer 20 to also be removed.

3. Trilayer Bonding Scheme I

Figure 4:
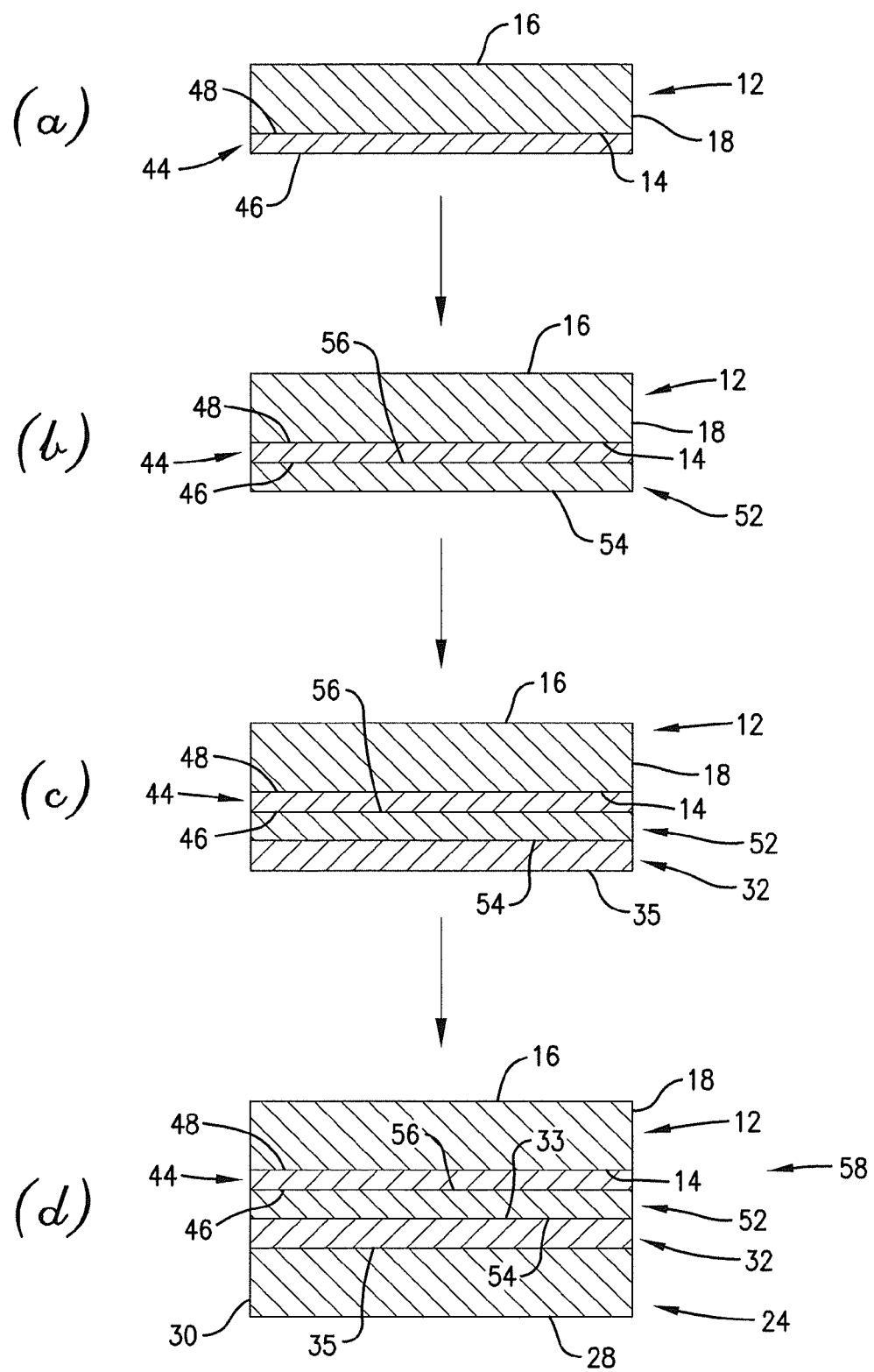
FIGS. 4a-4d are cross-sectional views of schematic drawings showing an alternative embodiment of the invention, as further exemplified in Example 17.

The first trilayer bonding scheme is shown in FIG. 4, with like numbers representing like parts. The embodiment shown in FIG. 4 is similar to that shown in FIG. 3, except that first bonding layer 20 of FIG. 3 has been changed to second bonding layer 32 and an additional layer is added between "cleaning" or lift-off layer 44 and second bonding layer 32. Specifically, after the lift-off layer 44 has been formed on device surface 14 (as described previously, and see FIG. 4(*a*)), a rigid layer 52 having an upper surface 54 and a lower surface 56 is formed on upper surface 46 of lift-off layer 44 (FIG. 4(*b*)). As used herein, "rigid" refers to a layer that has a high shear modulus of at least 1 GPa, as determined by a rheometer. Furthermore, "rigid" refers to layers that do not flow at process temperatures (typically from about 150° C. to about 400° C., and preferably from about 200° C. to about 300° C.).

The compositions used to form rigid layer 52 would be the same types of compositions discussed above with respect to first bonding layer 20. Furthermore, rigid layer 52 would be formed in a manner similar to that described above with respect to first bonding layer 20 (including similar thicknesses, as described with respect to FIG. 1, if lift-off layer 44 is conformal in nature). Rigid layer 52 preferably has a thickness $T_3$ (if lift-off layer 44 is not conformal in nature) of from about 1 µm to about 35 µm, more preferably from about 1 µm to about 25 µm, and even more preferably from about 1 µm to about 15 µm.

Referring to FIG. 4(*c*), second bonding layer 32 is formed on upper surface 54 of rigid layer 52, using the same application methods and types of compositions described previously. In this embodiment, the thickness $T_3$ of second bonding layer 32 is from about 1 µm to about 35 µm, more preferably from about 1 µm to about 25 µm, and even more preferably from about 1 µm to about 15 µm.

Rigid layer 52 preferably has a softening point that is at least about 20° C. higher than the softening point of second bonding layer 32, more preferably from about 20° C. to about 300° C. higher, and even more preferably from about 20° C. to about 100° C. higher. This will typically result in rigid layer 52 having a softening point that is at least about 100° C., preferably from about 150° C. to about 400° C., and more preferably from about 200° C. to about 300° C.

Second substrate 24 is bonded to bonding layer 32, as described previously, to form a bonded stack 58 (FIG. 4(*d*)). The bonded stack 58 can then be subjected to further processing as described above. Once the first and second substrates 12 and 24 are ready to be separated, the bonded stack 58 is exposed to one of the previously-described remover solutions, so that the solution will dissolve lift-off layer 44, thus allowing the substrates 12 and 24 to be separated. Alternatively, separation can be effected by heating stack 58 so as to soften bonding layer 32, as described previously. In this latter instance, lift-off layer 44 is again functioning as a cleaning layer, and bonding layer residue can be removed by removing layer 44 with a remover solution.

4. Trilayer Bonding Scheme II

Figure 5:
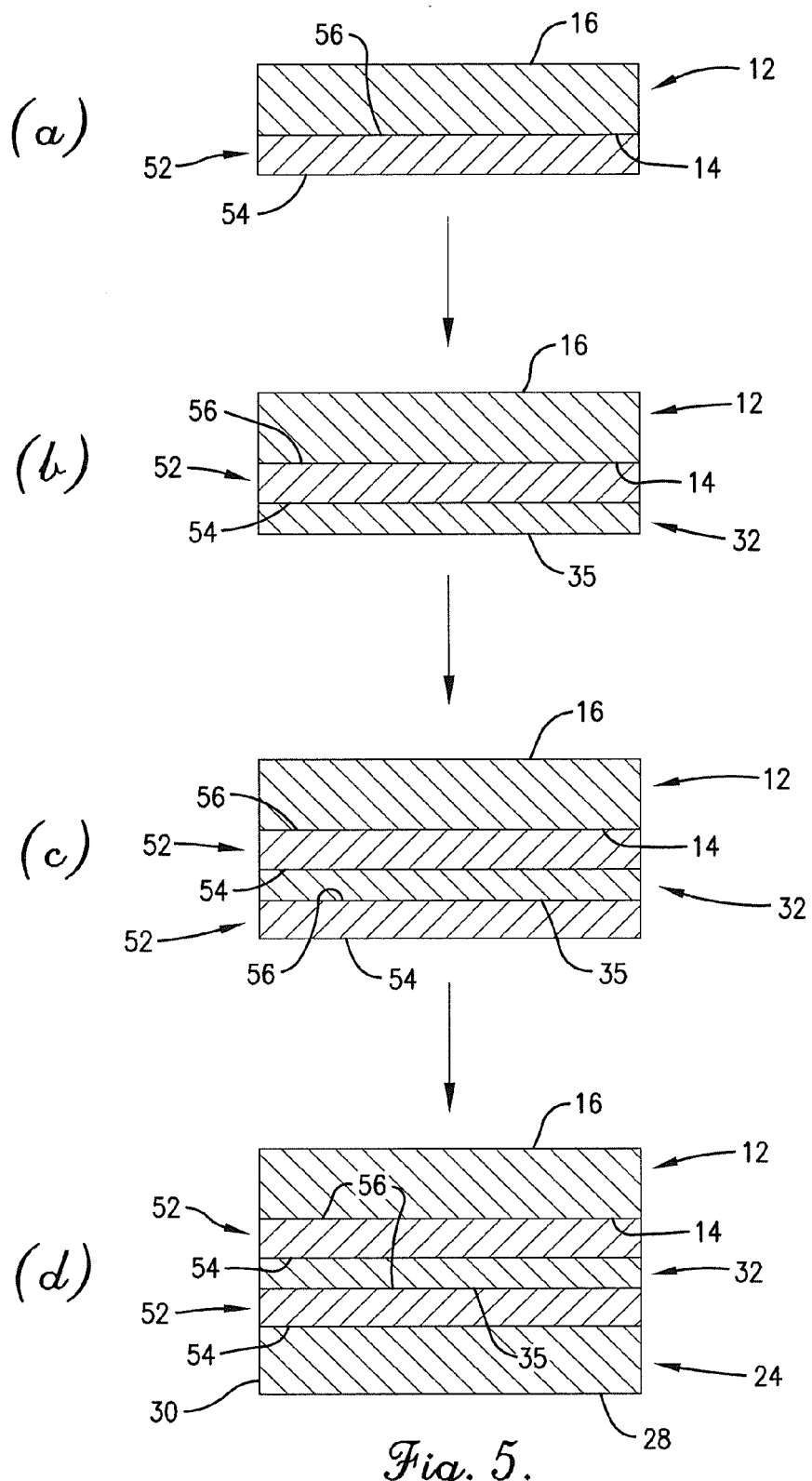
FIGS. 5a-5d are cross-sectional views of schematic drawings illustrating a variation of the embodiment of the invention that is shown in FIGS. 4a-4d.

Another trilayer bonding scheme is shown in FIGS. 5(*a*)-5(*d*), with like numbers representing like parts. This embodiment is a variation on the above embodiments in that the multilayer bonding system includes two rigid layers 52, with a layer of second bonding layer 32 between the two layers 52. Composition selection, processing parameters and steps, etc., are the same as described above for the corresponding layer. Although not shown, this embodiment could be modified by reversing the bonding layer 32 with one of the rigid layers 52 (and preferably the rigid layer 52 closest to second substrate 24).

5. Multiple Layers at Substrate Edge

Figure 6:
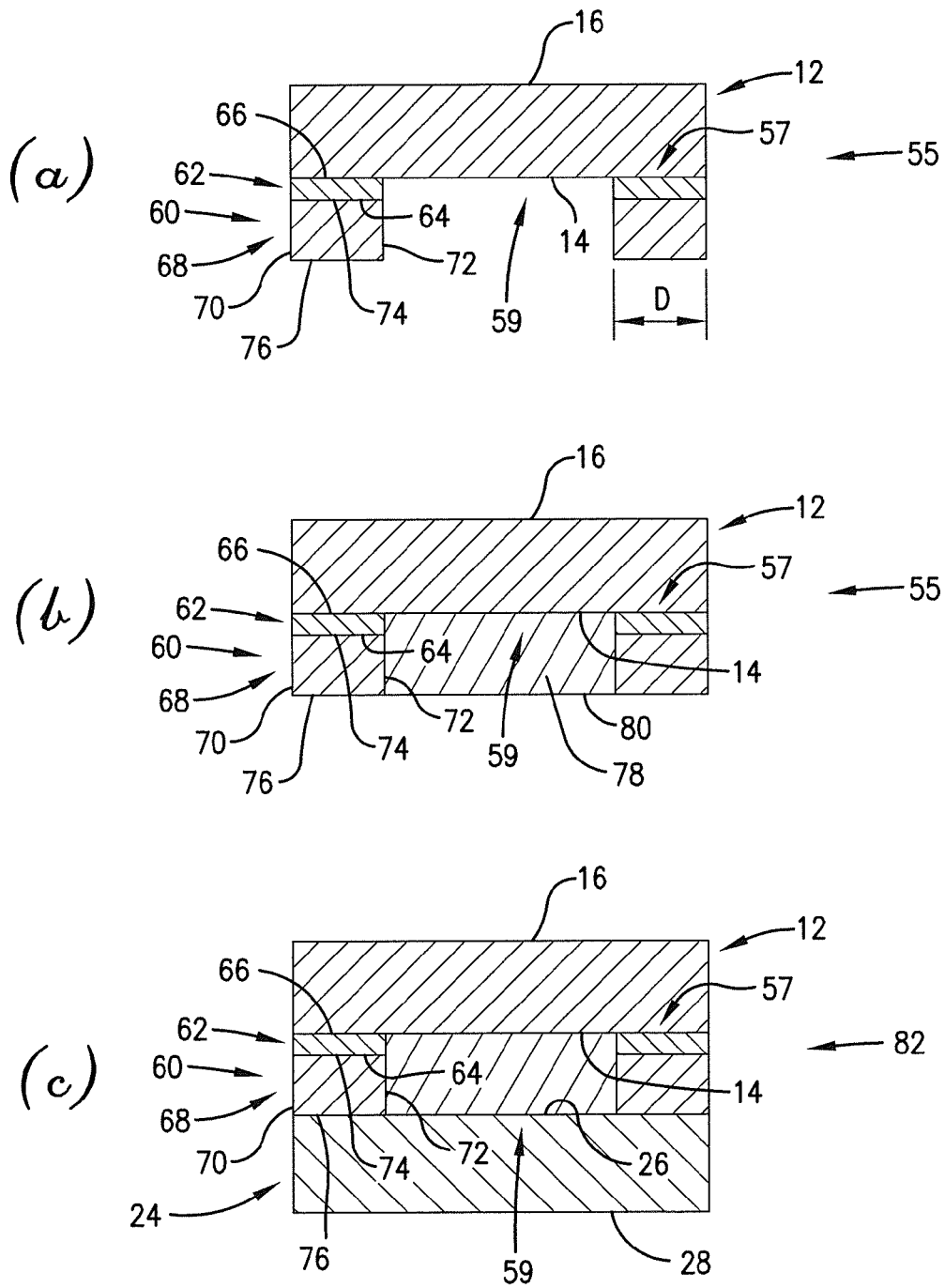
FIGS. 6a-6c are cross-sectional views of schematic drawings showing an alternative embodiment of the invention.
Figure 7:
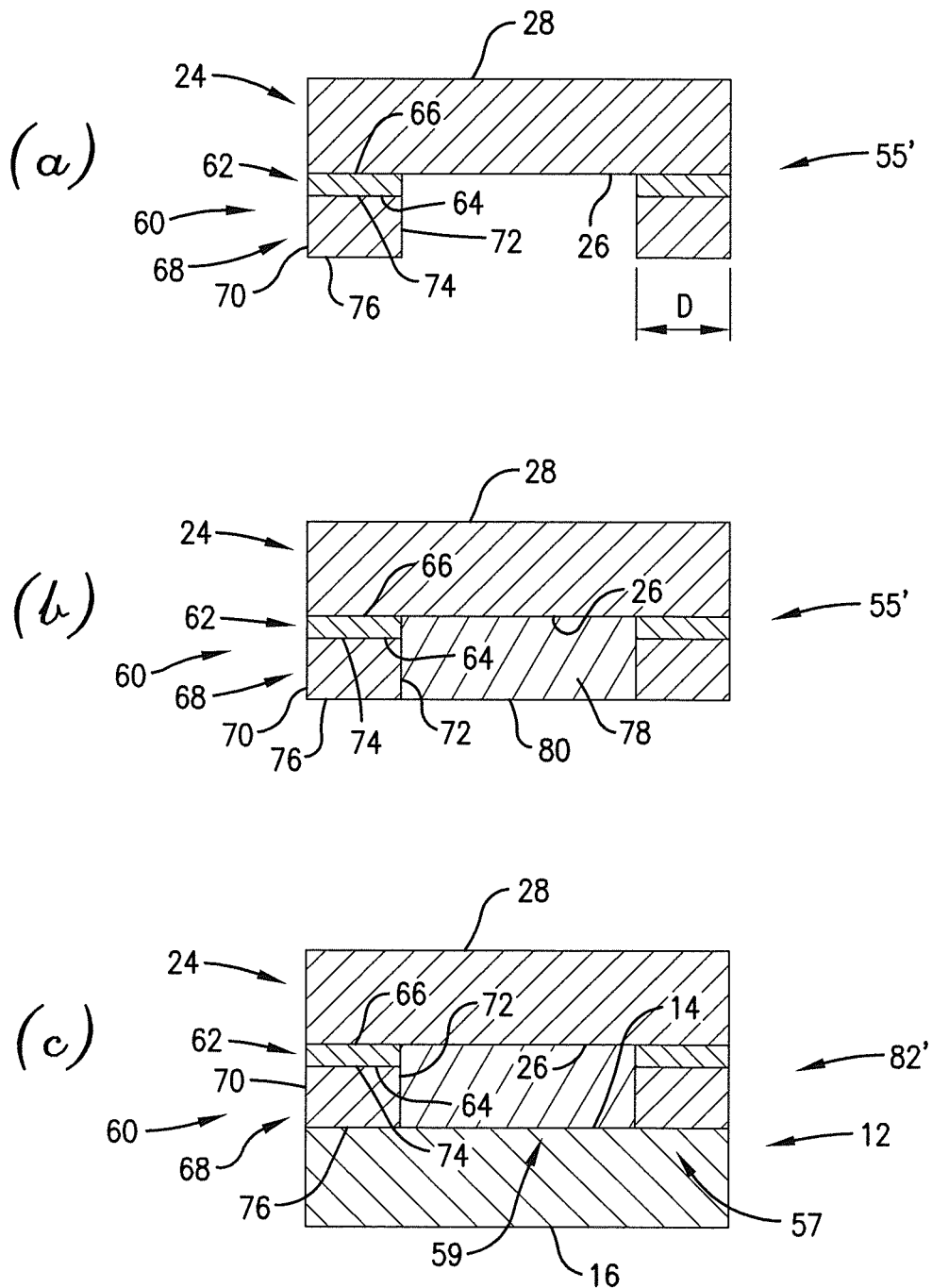
FIGS. 7a-7c are cross-sectional views of schematic drawings depicting a variation of the embodiment that is shown in FIGS. 6a-6c.

Further embodiments of the present invention are illustrated in FIGS. 6 and 7, with like parts being numbered in a like manner. For these embodiments, reference is made to U.S. Patent Publication No. 2009/0218560, incorporated by reference herein.

Referring to FIG. 6(*a*), in this embodiment, structure 55 is depicted. The device surface 14 of first substrate 12 includes a peripheral region 57, a central region 59, and a bilayer bonding system 60 at the peripheral region 57. System 60 includes thin layer 62, which has an upper surface 64 and a lower surface 66 as well as a bonding segment 68, which includes exterior surface 70, interior surface 72, lower surface 74, and bonding surface 76. Lower surface 66 of thin layer 62 is adjacent device surface 14 of first substrate 12 at peripheral region 57, while lower surface 74 of bonding segment 68 is adjacent thin layer 62.

Thin layer 62 can be a lift-off layer similar to that described above with respect to lift-off layer 44, or thin layer 62 can be an adhesion promoter layer. In instances where it is an adhesion promoter layer, any commercially available adhesion promoter composition can be used for this purpose. Some examples of such compositions include organo silanes (e.g., ProTEK® primer, available from Brewer Science, Inc.).

Thin layer 62 can be formed by conventional methods, such as spin-coating, followed by baking at temperatures suitable for the particular composition. For example, the methods followed to form lift-off layer 44 as described above could be used to form thin layer 62. Additionally, although FIG. 6(*a*) depicts this layer as only being present at peripheral region 57, thin layer 62 could also extend entirely across device surface 14, so that it is also present in central region 59. The thin layer 62 preferably has a thickness $T_3$ at peripheral region 57 of from about 1 µm to about 35 µm, more preferably from about 1 µm to about 25 µm, and even more preferably from about 1 µm to about 15 µm. In instances where thin layer 62 extends across the entire device surface 14, it will have a thickness $T_1$ of from about 0.1 µm to about 20 µm, preferably from about 0.25 µm to about 10 µm, and more preferably from about 1 µm to about 3 µm. In other instances, thin layer 62 could be a conformal layer, and thus would not have the above thicknesses.

Bonding segment 68 can be formed from any commercially available bonding composition, including those discussed above with respect to first and second bonding layers 20 and 32. Bonding segment 68 will typically have a width "D" of from about 2 mm to about 15 mm, preferably from about 2 mm to about 10 mm, and more preferably from about 2 mm to about 5 mm. Furthermore, bonding segment 68 preferably has a thickness $T_3$ of from about 5 µm to about 100 µm, more preferably from about 5 µm to about 50 µm, and even more preferably from about 10 µm to about 30 µm.

At this point, structure 55 could be bonded to a second substrate 24, as described with previous embodiments, or a fill layer 78 can be formed at central region 59 of device surface 14, as shown in FIG. 6(*b*). Fill layer 78 would have the same thicknesses as those described above with respect to bonding segment 68. Fill layer 78 is typically formed of a material comprising monomers, oligomers, and/or polymers dispersed or dissolved in a solvent system. If the fill layer 78 will be applied via spin-coating, it is preferred that the solids content of this material be from about 1% by weight to about 50% by weight, more preferably from about 5% by weight to about 40% by weight, and even more preferably from about 10% by weight to about 30% by weight. Examples of suitable monomers, oligomers, and/or polymers include those selected from the group consisting of cyclic olefin polymers and copolymers and amorphous fluoropolymers with high atomic fluorine content (greater than about 30% by weight) such as fluorinated siloxane polymers, fluorinated ethylene-propylene copolymers, polymers with pendant perfluoroalkoxy groups, and copolymers of tetrafluoroethylene and 2,2-bis-trifluoromethyl-4,5-difluoro-1,3-dioxole being particular preferred. It will be appreciated that the bonding strength of these materials will depend upon their specific chemical structures and the coating and baking conditions used to apply them.

In this embodiment, the fill layer 78 preferably does not form strong adhesive bonds, thus facilitating separation later. Generally speaking, amorphous polymeric materials that: (1) have low surface free energies; (2) are tack-free and known to not bond strongly to glass, silicon, and metal surfaces (i.e., would typically have very low concentrations of hydroxyl or carboxylic acid groups, and preferably no such groups); (3) can be cast from solution or formed into a thin film for lamination; (4) will flow under typical bonding conditions to fill device wafer surface topography, forming a void-free bond line between substrates; and (5) will not crack, flow, or redistribute under mechanical stresses encountered during backside processing, even when carried out at high temperatures or under high vacuum conditions, are desirable. As used herein, low surface free energy is defined as a polymeric material that exhibits a contact angle with water of at least about 90 and a critical surface tension of less than about 40 dynes/cm, preferably less than about 30 dynes/cm, and more preferably from about 12 dynes/cm to about 25 dynes/cm, as determined by contact angle measurements.

Low bonding strength refers to polymeric materials that do not stick or can be peeled from a substrate with only light hand pressure such as might be used to debond an adhesive note paper. Thus, anything with an adhesion strength of less than about 50 psig, preferably from less than about 35 psig, and more preferably from about 1 psig to about 30 psig would be desirable for use as fill layer 22. Examples of suitable polymeric materials exhibiting the above properties include some cyclic olefin polymers and copolymers sold under the APEL® by Mitsui, TOPAS® by Ticona, and ZEONOR® by Zeon brands, and solvent-soluble fluoropolymers such as CYTOP® polymers sold by Asahi Glass and TEFLON® AF polymers sold by DuPont. The bonding strength of these materials will depend upon the coating and baking conditions used to apply them.

At this point, a second substrate can be bonded to the structure 55 using the steps described with previous embodiments to form bonded stack 82 as shown in FIG. 6(c). After the desired processing is completed on stack 82, first substrate 12 and second substrate 24 can be readily separated. In one separation method, the bonding segment 68 is first dissolved with the aid of a solvent or other chemical agent. This can be accomplished by immersion in the solvent, or by spraying a jet of the solvent onto bonding segment 68 in order to dissolve it. The use of thermoplastic materials is especially desirable if solvent dissolution is to be used to disrupt the bonding segment 68. Solvents that could typically be used during this removal process include those selected from the group consisting of ethyl lactate, cyclohexanone, -methylpyrrolidone, aliphatic solvents (e.g., hexane, decane, dodecane, and dodecene), and mixtures thereof.

The substrates 12 and 24 can also be separated by first mechanically disrupting or destroying the continuity of the bonding segment 68 using laser ablation, plasma etching, water jetting, or other high energy techniques that effectively etch or decompose the bonding segment 68. It is also suitable to first saw or cut through the bonding segment 68 or cleave the bonding segment 68 by some equivalent means.

Regardless of which of the above means is utilized, a low mechanical force (e.g., finger pressure, gentle wedging) can then be applied to completely separate the substrates 12 and 24. Advantageously, separation does not require having to overcome strong adhesive bonds between the fill layer 78 and the substrates 12 or 24. Instead, it is only necessary to release the adhesive bonds at bonding segment 68 in the peripheral region 57 for separation to occur. The surfaces of the substrates 12 and/or 24 can then be rinsed clean with appropriate solvents as necessary to remove any residual material.

With respect to the above embodiment, it should be noted that the formation of bonding segment 68 before the formation of fill layer 78 is only one possible order of formation. It is also possible to form the fill layer 78 first, followed by formation of bonding system 60 or bonding segment 68. Order of formation is not critical to the invention and can be varied by one of ordinary skill in the art.

Referring to FIG. 7, a further embodiment of the invention is shown, with like numbering representing like parts. This embodiment is similar to FIG. 6, except that the first and second substrates 12 and 24 have been switched. That is, the thin layer 62 is in contact with carrier surface 26 of second substrate 24 rather than device surface 14 of first substrate 12, and the bonding surface 76 of bonding segment 68 is bonded to device surface 14 of first substrate 12. Thus, thin layer 62 can be adjacent lower surface 74 or bonding surface 76 of bonding segment 68, or both, depending upon the needs of the particular application. In this embodiment, thin layer 62 will have the thickness $T_3$ described with respect to the FIG. 6 embodiment, and these thicknesses will hold true across the entire thin layer 62.

6. Multiple Layers with Zone Region at Substrate Edge

Figure 8:
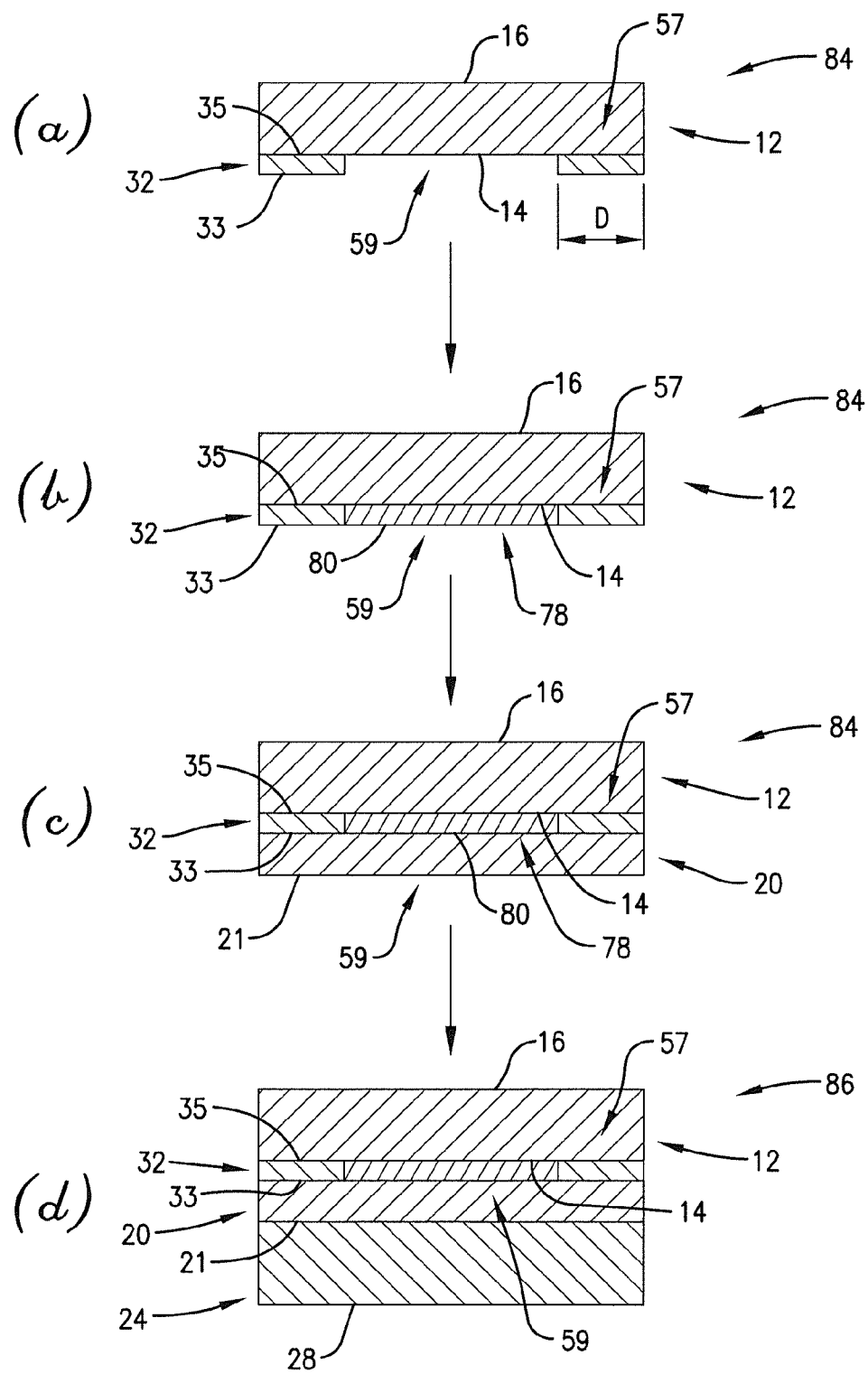
FIGS. 8a-8d are cross-sectional views of schematic drawings showing an alternative embodiment of the invention.

FIG. 8 depicts a further embodiment of this invention, with like numbers representing like parts. Referring to FIG. 8(a), a second bonding layer 32 is formed at only the peripheral region 57 of first substrate 12. Application methods, desired properties (including softening point), and possible compositions for use as second bonding layer 32 are as described previously. Referring to FIG. 8(b), a fill layer 78 is formed in central region 59 of device surface 14, as described with respect to FIGS. 6 and 7 above.

Next, and as shown in FIG. 8(c), a first bonding layer 20 is formed on upper surface 33 of second bonding layer 32 and on upper surface 80 of fill layer 78 to form a structure 84. Again, application methods, desired properties, and possible compositions for use as first bonding layer 20 are as described previously. Second substrate 24 can be bonded to the structure 84 using the steps described with previous embodiments to form bonded stack 86 as shown in FIG. 8(d). (Alternatively, as described in Example 18, first bonding layer 20 could instead be formed on carrier surface 21 of second substrate 24, and then the two structures could be pressed together to form bonded stack 86, similar to the order of steps shown in FIG. 1.)

The bonded stack 86 can then be subjected to further processing as described above. Once the first and second substrates 12 and 24 are ready to be separated, the bonded stack 86 is exposed to a remover solution (e.g., limonene, dodecene, PGME), so that the solution will dissolve second bonding layer 32, thus allowing the substrates 12 and 24 to be separated. Alternatively, separation can be effected by heating stack 86 so as to soften second bonding layer 32, which has a lower softening point than first bonding layer 20, so that the substrates 12 and 24 can be separated, as described previously.

Figure 9:
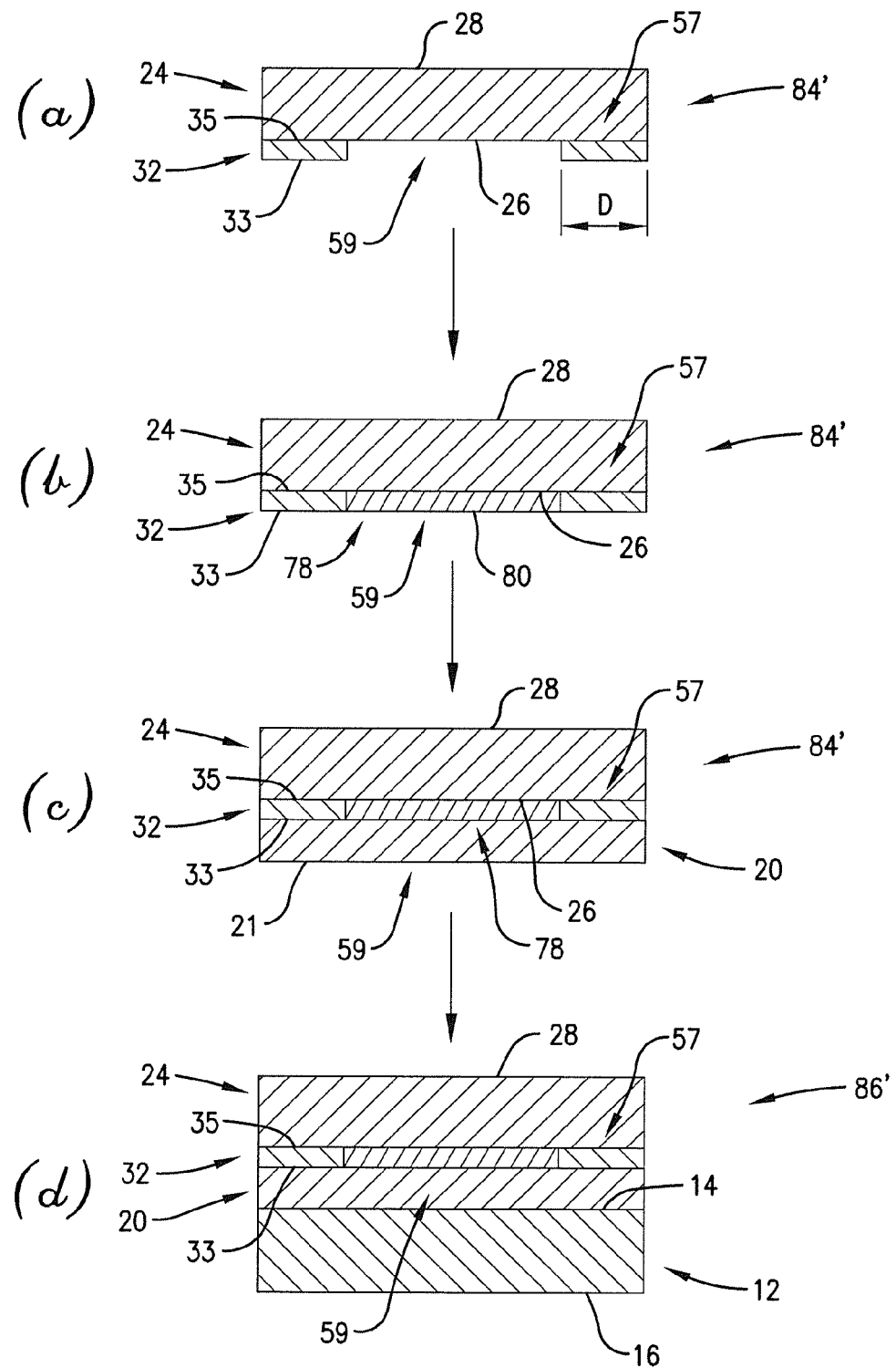
FIGS. 9a-9d are cross-sectional views of schematic drawings depicting a variation of the embodiment that is shown in FIGS. 6a-6c, with this variation being similar to the process that is exemplified in Example 18.

Referring to FIG. 9, a further embodiment of the invention is shown, with like numbering representing like parts. This embodiment is similar to that of FIG. 8, except that the first and second substrates 12 and 24 have been switched. That is, the second bonding layer 32 and fill layer 78 are in contact with carrier surface 26 of second substrate 24 rather than device surface 14 of first substrate 12, and the first bonding layer 20 is bonded to device surface 14 of first substrate 12. Thus, the location of second bonding layer 32 and fill layer 78 can be adjusted, depending upon the needs of the particular application.

For each of the above bonding schemes where the various bonding, lift-off, and rigid layers have been shown to substantially and even completely cover the particular substrate surface, it will be appreciated that one or more of these layers could be modified to span only part of the particular substrate (even if not shown). In other words, only a portion of the particular substrate surface would be in contact with that particular layer, and this would still be in the scope of the present invention.

Furthermore, even in instances where layers have been shown to be formed one on top of another on a first substrate (device) followed by bonding with a second substrate (carrier), all layers could instead be formed one on top of another on the second substrate and then bonded with the first substrate. Or, one or more layers could be formed on the first substrate while other layers are formed on the second substrate, and then the two substrates are bonded together. Order is not critical, so long as the resulting structure has the layer systems shown and/or described herein.

EXAMPLES

The following examples set forth preferred methods in accordance with the invention. It is to be understood, however, that these examples are provided by way of illustration and nothing therein should be taken as a limitation upon the overall scope of the invention.

Examples 1 through 9 illustrate the invention's improved bonding performance. Examples 10 through 16 illustrate the improved ability of the bonding compositions to be cleaned after debonding.

Example 1

Composition of Cyclic Olefin Copolymer (COC) Bonding Composition A

In this formulation, 250 grams of an ethene-norbornene copolymer (APL 8008T, obtained from Mitsui Chemicals America, Inc., Rye Brook, N.Y.) and 3.125 grams of a phenolic antioxidant (IRGANOX 1010, obtained from BASF, Germany) were dissolved in 373.45 grams of R-limonene (obtained from Florida Chemical Co., Winter Haven, Fla.) and 373.45 grams of cyclooctane (obtained from Sigma-Aldrich, Inc., St. Louis, Mo.). The mixture was allowed to stir at room temperature until all of the components dissolved. The final solution had 25.31% solids.

Example 2

Composition of COC Bonding Composition B

In this formulation, 210.31 grams of an ethane-norbornene copolymer (Topas 8007, obtained from Topas Advanced Polymers, Florence, Ky.) and 62.4 grams of a low-molecular-weight COC polymer (Topas™, obtained from Topas Advanced Polymers, Florence, Ky.) were dissolved in 706 grams of R-limonene along with 4.0 grams of a phenolic antioxidant (Irganox 1010) and 14.5 grams of polyisobutylene (obtained from Scientific Polymer Products, Inc., Ontario, N.Y.) with a molecular weight of 2,800 Daltons. The mixture was allowed to stir at room temperature until all of ingredients were in solution. The solution had 29% solids.

Example 3

Composition of COC Bonding Composition C

In this formulation, 50 grams of COC Bonding Composition B from Example 2 were mixed with 50 grams of R-limonene. The mixture was allowed to stir at room temperature to form a solution. The solution had 14.5% solids.

Example 4

Composition of Bonding Composition D

In this formulation, 120 grams of WaferBOND® HT-10.10 material (obtained from Brewer Science, Inc.) were mixed with 80 grams of 1-dodecene (Sigma-Aldrich, St. Louis, Mo.). The mixture was allowed to stir at room temperature to form a solution.

Example 5

Thick COC Bonding Composition A Layer on Device Wafer and Thin COC Bonding Composition C Layer on Carrier Wafer In this procedure, 10 mL of the COC Bonding Composition A from Example 1, which was a cyclic olefin polymer coating layer designed to flow sufficiently at 270° C. to achieve effective bonding between the coated substrate and a second substrate, were spin-coated on a 200-mm silicon wafer and baked (using the spin and bake parameters described below) to form a film of COC Bonding Composition A. This process was exactly repeated with a second aliquot of 10 mL of the COC Bonding Composition A from Example 1, with this second aliquot being used to form a film on top of the first film. The final film thickness after both application steps was 96 µm.

COC Bonding Composition C from Example 3, which was a cyclic olefin polymer coating layer designed to flow sufficiently at 220° C. to achieve effective bonding between the coated substrate and a second substrate, was spin-coated on another 200-mm silicon wafer. The thickness of COC Bonding Composition C was about 3 µm. The spin-coating and baking parameters were the same for COC Bonding Composition A and COC Bonding Composition C and were as follows.

Spin-coating conditions: 800 rpm spin-coat for 60 seconds, with 10,000 rpm/sec acceleration.

Baking conditions, in order: 80 C for 2 minutes, 110 C for 2 minutes, 160 C for 2 minutes, and 220 C for 6 minutes.

The two silicon wafers coated with COC Bonding Composition A and COC Bonding Composition C as described above were bonded in a face-to-face relationship under vacuum at 220° C. for 3 minutes in a heated vacuum in a pressure chamber with 5,800 N of bonding pressure. A debonder that uses a sliding process similar to that described in U.S. Patent Publication No. 2010/0206479, incorporated by reference (obtained from Brewer Science, Inc., Rolla, Mo.) then separated the bonded wafers at 220° C.

Example 6

Thick COC Bonding Composition A and Thin COC Bonding Composition C

In this procedure, 10 mL of the COC Bonding Composition A from Example 1, which was a cyclic olefin polymer coating layer designed to flow sufficiently at 270° C. to achieve effective bonding between the coated substrate and a second substrate, were spin-coated on a 200-mm silicon wafer and baked (using the spin and bake parameters described below) to form a film of COC Bonding Composition A. This process was exactly repeated with a second aliquot of 10 mL of the COC Bonding Composition A from Example 1, with this second aliquot being used to form a film on top of the first film. The final film thickness after both application steps was 93 µm.

COC Bonding Composition C from Example 3, a cyclic olefin polymer coating layer designed to flow sufficiently at 220° C. to achieve effective bonding between the coated substrate and a second substrate, was spin-coated on top of the COC Bonding Composition A film. The thickness of the COC Bonding Composition C film was 8 µm. The spin-coating and baking parameters were the same for COC Bonding Composition A and COC Bonding Composition C and were as follows:

Spin-coating conditions: 800 rpm spin-coat for 60 seconds, with 10,000 rpm/second acceleration.

Baking conditions, in order: 110° C. for 4 minutes, 160° C. for 2 minutes, and 220° C. for 6 minutes.

The center of another 200-mm silicon wafer was coated with fluorinated silane(heptadeccafluoro-1,1,2,2-tetrahydrodecyl trichlorosilane), while a 3-mm region along the outer edge of the wafer was left without the fluorinated silane. The detailed process for coating the fluorinated silane is described in Example 1 of U.S. Patent Publication No. 2009/0218560, incorporated by reference herein.

The wafer pair described above was bonded in a face-to-face relationship at 220° C. for 3 minutes in a heated vacuum and under pressure with 5,800 N of bonding pressure. The wafer pair was bonded together strongly, and it underwent the grinding process that thinned the device wafer to 50 µm. The bonded wafer pair was soaked in R-limonene for 24 hours, and then the wafers were debonded by a peel-off process using a peel-off debonder (ZoneBOND™ Separation Tool, obtained from Brewer Science, Inc., Rolla, Mo.). During the peel-off debonding process, the device wafer was held by vacuum on a flat surface, and the carrier wafer (silanated wafer) was held tightly by a metal clamp. The device wafer was then separated from the carrier wafer by peeling the clamp.

Example 7

Thick Polysulfone with Thin Bonding Composition D

In this formulation, 280 grams of polysulfone (Ultrason E2020P; BASF, Flortham Park, N.J.) were dissolved in 520 grams of dimethylacetamide (Sigma-Aldrich, St. Louis, Mo.). The mixture was allowed to stir at room temperature until the polysulfone dissolved to form a solution. The solution had 35% solids.

The above polysulfone solution was spin-coated on a 200-mm silicon wafer at a spin speed of 600 rpm for 60 seconds. The coated wafer was baked for 2 minutes at 80° C. and then for 2 minutes at 150° C. and then for 5 minutes at 180° C. The thickness of resulting polysulfone film was 51.64 µm. Bonding Composition D from Example 4 was then spin-coated on top of the polysulfone film at a spin speed of 1400 rpm for 60 seconds. The wafer was baked at 80° C. for 2 minutes, then at 150° C. for 2 minutes, and then at 180° C. for 5 minutes. The total thickness of the diluted WaferBOND® HT-10.10 film was about 2 µm.

The wafer pair was soaked for 24 hours at room temperature in R-limonene, and the wafers were then separated using a peel debonder (ZoneBOND™ Separation Tool).

Example 8

Thick Polysulfone with Thin COC Bonding Composition C

In this formulation, 280 grams of polysulfone (Ultrason E2020P) were dissolved in 520 grams of dimethylacetamide (Sigma-Aldrich, St. Louis, Mo.). The mixture was stirred at room temperature until the polysulfone dissolved to form a solution.

The above polysulfone solution was spin-coated on a 200-mm silicon wafer at a spin speed of 600 rpm for 60 seconds. The coated wafer was baked at 80° C. for 2 minutes, then at 150° C. for 2 minutes, and then at 180° C. for 5 minutes to remove the casting solvent completely. The thickness of the polysulfone film was 52.9 µm. COC Bonding Composition C from Example 3 was then spin-coated on top of the polysulfone film at a spin speed of 1,400 rpm for 60 seconds. The wafer was baked at 80° C. for 2 minutes, then at 150° C. for 2 minutes, and then at 180° C. for 5 minutes. The total thickness of COC Bonding Composition C was about 2 µm.

The wafer pair above was soaked for 24 hours at room temperature in R-limonene and then separated using a peel debonder (ZoneBOND™ Separation Tool).

Example 9

Thick COC Bonding Composition A and a >20-µm Film of COC Bonding Composition B for Slide Debonding In this Example, 10 mL aliquots of the COC Bonding Composition A from Example 1, a cyclic olefin polymer coating layer designed to flow sufficiently at 270° C. to achieve effective bonding between the coated substrate and a second substrate, was spin-coated twice on a 200-mm silicon wafer. The first spin-coating was carried out at 600 rpm for 60 seconds, and the second spin-coating was carried out at 800 rpm for 60 seconds. After each coating, the wafer was baked at 80° C. for 2 minutes, then at 150° C. for 2 minutes, and then at 220° C. for 5 minutes. The thickness of the resulting COC Bonding Composition A film was 99.14 µm.

COC Bonding Composition B from Example 2, a cyclic olefin polymer coating layer designed to flow sufficiently at 220° C. to achieve effective bonding between the coated substrate and a second substrate, was spin-coated on the same wafer that was coated with COC Bonding Composition A. COC Bonding Composition B was coated at a spin speed of 1500 rpm for 60 seconds. The wafer was baked at 80° C. for 2 minutes, then at 150° C. for 2 minutes, and then at 220° C. for 5 minutes. The thickness of the resulting COC Bonding Composition B film was about 29 µm.

The wafer described above was bonded in a face-to-face relationship with another 200-mm silicon wafer under heated vacuum at 220° C. for 3 minutes in a pressure chamber with 5,800 N of bonding pressure.

A slide debonding process using a slide debonder (obtained from Brewer Science, Inc.) separated the bonded wafer pair. The debonding process was carried out at a debonding rate of 2 mm/second and at a temperature of 220° C.

Example 10

Poly(Vinyl Pyridine) and COC Bonding Composition B Cleaned with HCl Solution

In this formulation, 2 grams of poly(vinyl pyridine) (obtained from Sigma-Aldrich, St. Louis, Mo.) were dissolved in cyclopentanone. The mixture was allowed to stir at room temperature until the polymer dissolved. The total weight concentration of poly(vinyl pyridine) in cyclopentanone was 2%. The solution was filtered through a 0.1-μm filter.

The above poly(vinyl pyridine) composition was spin-coated on a 100-mm silicon wafer at a spin speed of 2,000 rpm for 60 seconds. The coated wafer was baked at 80° C. for 2 minutes and then at 220° C. for 2 minutes. The thickness of the resulting poly(vinyl pyridine) film was 0.0579 μm (57.9 nm). COC Bonding Composition B was then spin-coated on top of the poly(vinyl pyridine) film at a spin speed of 1,100 rpm for 60 seconds. The wafer was baked at 80° C. for 2 minutes, then at 160° C. for 2 minutes, and then at 220° C. for 6 minutes. The total thickness of the resulting polymer film was about 22 μm.

The coated wafer was dipped in 1% hydrochloride (HCl) aqueous solution at room temperature for about 4 to 5 hours until the COC Bonding Composition B film lifted off from the wafer. The wafer was clean by visual observation, but some residue was still evident when it was viewed under a microscope.

Example 11

Poly(Vinyl Pyridine) and COC Bonding Composition B Cleaned with Acetic Acid Solution A wafer was prepared with the same compositions and in the same manner as the one in Example 10. The coated wafer was dipped in 50% acetic acid aqueous solution at room temperature for about 4 to 5 hours until the COC Bonding Composition B film lifted off the wafer.

The wafer cleaned with the acetic acid solution was clean by visual observation, but some residue was still evident when it was viewed under a microscope.

Example 12

Poly(Vinyl Pyridine) and COC Bonding Composition B Cleaned with R-limonene, Cyclopentanone, and Isopropanol Another wafer coated with the same formulation and in the same manner as in Example 10 was allowed to spin at room temperature at a speed of 900 rpm while R-limonene was dispensed for 400 seconds as the first cleaning solvent to remove the COC Bonding Composition B film. Then further cleaning was performed at room temperature by dispensing cyclopentanone at a spin speed of 900 rpm for 400 seconds to remove the poly(vinyl pyridine) polymer film. The wafer was spin rinsed with isopropanol for 120 seconds at a spin speed of 900 rpm. Final drying was performed by spinning the wafer at a speed of 1200 rpm for 60 seconds. The wafer cleaned by this process was defect-free by visual observation.

Example 13

Poly(Vinyl Pyridine) and COC Bonding Composition B Cleaned with R-limonene and Isopropanol Another wafer coated with the same formulation and in the same manner as in Example 10 was allowed to spin at room temperature at a speed of 900 rpm while R-limonene was dispensed for 400 seconds as the first cleaning solvent to remove the COC Bonding Composition B film. Then further cleaning was performed at room temperature by dispensing isopropanol for 400 seconds at a spin speed of 900 rpm to remove the poly(vinyl pyridine) polymer film. Final drying was performed by spinning the wafer at a speed of 1,200 rpm for 60 seconds. The wafer cleaned by this process was defect-free by visual observation.

Example 14

ProLIFT® 100-16 Coating and WaferBOND® HT-10.10 Material

ProLIFT® 100-16 coating (obtained from Brewer Science, Inc., Rolla, Mo.) was spin-coated on a 200-mm silicon wafer at 3,000 rpm for 90 seconds. The coated wafer was baked at 120° C. for 90 seconds and then at 205° C. for 90 seconds to produce a layer that was about 1 μm thick. WaferBOND® HT-10.10 material was spin-coated on top of the ProLIFT® 100-16 film at 1,500 rpm for 30 seconds. The wafer was baked at 120° C. for 2 minutes and then at 160° C. for 2 minutes to produce a layer that was about 16 μm thick. Another 200-mm silicon wafer was bonded to the coated wafer in a face-to-face relationship at 220° C. for 3 minutes under a pressure of 15 psi for 1 minute. The bonded wafer pair was cooled to 160° C. for 1 minute and gradually to room temperature. The bonded wafer pair was separated by using a slide debonder at a rate of 2.00 mm/second and at a temperature of 200° C.

The coating on the debonded wafer was cleaned first by dispensing 1-dodecene at a spin speed of 250 rpm for 60 seconds to remove the WaferBOND® HT-10.10 polymeric film and then by dispensing ProLIFT® Remover (obtained from Brewer Science, Inc., Rolla, Mo.) at a spin speed of 300 rpm for 10 seconds to clean the ProLIFT® film. The wafer was dried by spinning at a speed of 1,400 rpm for 15 seconds. The wafer was visually defect-free after cleaning.

Example 15

ProLIFT® 100 Coating and COC Bonding Composition B

ProLIFT® 100-16 coating was spin-coated on a 200-mm silicon wafer at 3,000 rpm for 90 seconds. The coated wafer was baked at 100° C. for 120 seconds and then 245° C. for 60 seconds. COC Bonding Composition B from Example 2 was spin-coated on top of the ProLIFT® 100-16 film at 300 rpm for 5 seconds. The speed was ramped up, and the wafer was spun at 1,200 rpm for 60 seconds. The coated wafer was baked at 60° C. for 60 seconds, then at 80° C. for 60 seconds, and then at 220° C. for 120 seconds.

The wafer was cleaned first by using R-limonene to remove the COC Bonding Composition B polymer film and then by dispensing PD523-AD developer (JSR Microelectronics, Sunnyvale, Calif.) to remove the ProLIFT® 100-16 film. The specific cleaning procedure was as follows:

Cleaning the COC Bonding Composition B:
1. Puddle R-limonene: 0 rpm for 60 seconds
2. Spin off: 2,000 rpm for 5 seconds
3. Manually dispense R-limonene: 500 rpm for 60 seconds
4. Spin off: 2,000 rpm for 5 seconds
5. Manually dispense isopropanol to rinse: 500 rpm for 30 seconds
6. Spin dry: 2,000 rpm for 15 seconds Cleaning the ProLIFT® 100-16 coating:
1. Puddle PD523-AD developer: 0 rpm for 20 seconds
2. Spin off: 2,000 rpm for 5 seconds
3. Manually dispense deionized water: 500 rpm for 20 seconds
4. Manually dispense isopropanol to rinse: 500 rpm for 5 seconds
5. Spin dry: 2,000 rpm for 15 seconds The wafer was confirmed to be clean by defect inspection using a Candela CS20 tool (obtained from KLA Tencor, Milpitas, Calif.).

Example 16

WGF 300-310 Material and COC Bonding Composition B

WGF 300-310 material (a developer soluble gap fill composition obtained from Brewer Science, Inc., Rolla, Mo.) was spin-coated onto a 200-mm silicon wafer at 3,000 rpm for 90 seconds. The coated wafer was baked at 100° C. for 120 seconds and then at 245° C. for 60 seconds to produce a film that was about 720 Å thick. COC Bonding Composition B from Example 2 was spin-coated on the top of the WGF 300-310 film at 300 rpm for 5 seconds, and then the speed was ramped up and the wafer was spun at 1,200 rpm for 60 seconds. The coated wafer was then baked at 60° C. for 60 seconds, then at 80° C. for 60 seconds, and then at 220° C. for 120 seconds.

The wafer was cleaned first by using R-limonene to remove the COC Bonding Composition B polymer film and then by dispensing PD523-AD developer to remove the WGF 300-310 film. The specific cleaning procedure was as follows:

Cleaning the COC Bonding Composition B
1. Puddle R-limonene: 0 rpm for 60 seconds
2. Spin off: 1,500 rpm for 5 seconds
3. Manually dispense R-limonene: 500 rpm for 60 seconds
4. Spin off: 1,500 rpm for 5 seconds
5. Manually dispense isopropanol for rinsing: 500 rpm for 0 seconds
6. Spin dry: 2,000 rpm for 15 seconds Cleaning the WGF 300-310 coating:
1. Puddle PD523-AD developer: 0 rpm for 20 seconds
2. Spin off: 1,500 rpm for 5 seconds
3. Manually dispense deionized water: 500 rpm for 20 seconds
4. Manually dispense isopropanol for rinsing: 500 rpm for 5 seconds
5. Spin dry: 2,000 rpm for 15 seconds The wafer was confirmed to be clean by defect inspection using a Candela CS20 tool.

Example 17

WGF 300-310 Material, COC Bonding Composition A, and COC Bonding Composition B

WGF 300-310 material was spin-coated on a 100-mm silicon wafer at 3,000 rpm for 90 seconds. The wafer was baked at 100° C. for 120 seconds and then at 245° C. for 60 seconds. The thickness of the WGF 300-310 film was 0.0632 µm (63.2 nm). COC Bonding Composition A from Example 1 was spin-coated on top of the WGF 300-310 film at a speed of 600 rpm for 60 seconds. The wafer was then baked at 80° C. for 2 minutes, then at 150° C. for 2 minutes, and then 220° C. for 5 minutes. The thickness of the COC Bonding Composition A layer was 41 µm. COC Bonding Composition B from Example 2 was spin-coated on top of the COC Bonding Composition A film at a speed of 1,400 rpm for 60 seconds. The wafer was then baked at 80° C. for 2 minutes, then at 150° C. for 2 minutes, and then at 220° C. for 5 minutes. The thickness of the COC Bonding Composition B layer was 8.2 µm.

The wafer described above was first cleaned by immersing it in R-limonene for 24 hours to remove the COC Bonding Composition A and B polymer layers. Then a second step to clean the WGF 300-310 film with PD523-AD developer was carried out as follows:

1. Puddle PD523-AD developer: 0 rpm for 20 seconds
2. Spin off: 2,000 rpm for 5 seconds
3. Manually dispense deionized water: 500 rpm for 20 seconds
4. Manually dispense isopropanol to rinse: 500 rpm for 5 seconds
5. Spin dry: 2,000 rpm for 15 seconds The wafer was clean, by visual observation.

Example 18

Using Multiple Layers to Assist in ZoneBOND™ Edge Cutting

An approximately 1-nm thick layer of WaferBOND® HT-10.10 was coated onto a 3-5-mm wide ring around the edge of the surface of a 200-mm silicon carrier wafer. This wafer was baked at 110° C. for 2 minutes, followed by a second bake at 160° C. for 2 minutes. A fluorinated silane ((heptadecafluoro-1,1,2,2-tetrahydradecyl)trichlorosilane, a perfluoro compound with primarily $C_{12}$, sold under the name Fluorinert by 3M) was diluted to a 1% solution using FC-40 solvent (obtained from 3M). The solution was spin-coated onto the center section of the carrier. The carrier was baked on a hotplate at 100° C. for 1 minute, rinsed with FC-40 solvent in a spin coater and baked on a hotplate at 100° C. for an additional 1 minute.

The surface of another 200-mm silicon device wafer was coated with a COC bonding composition via spin-coating. This wafer was baked at 80° C. for 2 minutes followed by 120° C. for 2 minutes and finally 220° C. for 2 minutes. The device and carrier wafers were bonded in a face-to-face relationship under vacuum at 220° C. for 3 minutes in a heated vacuum and pressure chamber.

The assembly was soaked in 1-dodecene for approximately one hour to soften and partially dissolve the thin layer of WaferBOND® HT-10.10 at the edge of the carrier. The 1-dodecene did not affect the bulk of the experimental bonding adhesive, only the WaferBOND® HT-10.10. The carrier was separated from the assembly using a ZoneBOND™ Separation Tool.

Having described the invention, the following is claimed:
1. A temporary bonding method comprising:
  applying a lift-off layer to a device surface of a first substrate;
  forming a bonding layer on the lift-off layer;
  positioning a carrier surface of a second substrate proximate to a surface of the bonding layer;

moving the carrier surface of the second substrate and the surface of the bonding layer into contact with each other;

bonding the carrier surface of the second substrate to the surface of the bonding layer to form a bonded stack; and separating the first substrate from the second substrate by treating the lift-off layer.

2. The method of claim 1, wherein the lift-off layer is applied by spin-coating.

3. The method of claim 1, wherein the lift-off layer has a thickness T1 of less than about 3 μm.

4. The method of claim 1, wherein the lift-off layer is a conformal layer.

5. The method of claim 1, wherein compositions used to form the lift-off layer are selected so that the lift-off layer is soluble in solutions selected from the group consisting of 1% hydrochloric acid aqueous solution, 50% acetic acid aqueous solution, isopropanol, 1-dodecene, R-limonene, cyclopentanone, PGME, and tetramethylammonium hydroxide.

6. The method of claim 1, wherein the device surface includes at least one structure selected from the group consisting of: solder bumps; metal posts; metal pillars; and structures formed from a material selected from the group consisting of silicon, polysilicon, silicon dioxide, silicon (oxy) nitride, metal, low k dielectrics, polymer dielectrics, metal nitrides, and metal silicides.

7. The method of claim 1, wherein the second substrate includes one of the following materials: silicon, sapphire, quartz, metals (e.g., aluminum, copper, steel), and various glasses and ceramics.

8. The method of claim 3, wherein the thickness T1 is about 0.5 μm to about 3 μm.

9. The method of claim 8, wherein the thickness T1 is about 1.0 μm to about 1.5 μm.

10. The method of claim 1, wherein the step of separating the first substrate from the second substrate includes dissolving the lift-off layer.

11. A temporary bonding method comprising:

applying a lift-off layer to a device surface of a first substrate;

forming a bonding layer on the lift-off layer;

positioning a carrier surface of a second substrate proximate a surface of the bonding layer;

moving the carrier surface of the second substrate and the surface of the bonding layer into contact with each other;

bonding the carrier surface of the second substrate to the surface of the bonding layer to form a bonded stack;

heating the bonded stack to a predetermined temperature to soften the bonding layer; and separating the first substrate from the second substrate wherein at least a portion of the lift-off layer remains on the first substrate.

12. The method of claim 11, further including a step of dissolving the lift-off layer after said step of separating the first substrate from the second substrate.

* * * * *